US009444052B2

(12) United States Patent
Nakaie et al.

(10) Patent No.: US 9,444,052 B2
(45) Date of Patent: Sep. 13, 2016

(54) CHARGE-TRANSPORTING VARNISH

(75) Inventors: Naoki Nakaie, Funabashi (JP);
Yoshiomi Hiroi, Toyama (JP); Minoru Hoshino, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 72 days.

(21) Appl. No.: 14/346,115

(22) PCT Filed: Sep. 14, 2012

(86) PCT No.: PCT/JP2012/073602
§ 371 (c)(1),
(2), (4) Date: Mar. 20, 2014

(87) PCT Pub. No.: WO2013/042623
PCT Pub. Date: Mar. 28, 2013

(65) Prior Publication Data
US 2014/0227815 A1    Aug. 14, 2014

(30) Foreign Application Priority Data

Sep. 21, 2011  (JP) ................. 2011-205430

(51) Int. Cl.
C09D 5/24        (2006.01)
H01L 51/00       (2006.01)
(Continued)

(52) U.S. Cl.
CPC ............. *H01L 51/0059* (2013.01); *C09D 5/24* (2013.01); *C09D 7/1233* (2013.01);
(Continued)

(58) Field of Classification Search
CPC ........ C09D 5/00; C09D 201/00; C09D 5/24; C09D 7/1233; H01L 51/0021; H01L 51/00; H01L 51/0059; H01L 51/5056; H01L 51/5088
USPC ............................................. 438/46; 252/500
See application file for complete search history.

(56) References Cited

U.S. PATENT DOCUMENTS

| 7,771,842 | B2 | 8/2010 | Yoshimoto et al. |
| 7,862,747 | B2 | 1/2011 | Yoshimoto et al. |
| 2010/0159279 | A1* | 6/2010 | Kato ................... C07C 211/55 428/704 |

FOREIGN PATENT DOCUMENTS

| EP | 2 062 871 A1 | 5/2009 |
| JP | 2-195681 A | 8/1990 |

(Continued)

OTHER PUBLICATIONS

International Search Report, issued in PCT/JP2012/073602, dated Dec. 4, 2012.
(Continued)

*Primary Examiner* — Mark Kopec
*Assistant Examiner* — Danny N Kang
(74) *Attorney, Agent, or Firm* — Birch, Stewart, Kolasch & Birch, LLP

(57) ABSTRACT

This charge-transporting varnish, which contains a solvent, an electron-accepting dopant substance, and an aryldiamine compound represented by formula (1), imparts a charge-transporting thin film that has high transparency and can evince favorable element characteristics when applied to an organic EL element.

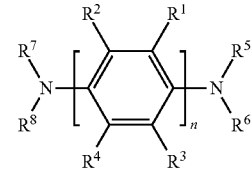

(1)

(In the formula: $R^1$-$R^4$ each independently represent a hydrogen atom, a halogen atom, a nitro group, a cyano group, a hydroxyl group, a thiol group, a phosphate group, a sulfone group, a carboxyl group, an alkoxy group having 1-20 carbon atoms, or the like; $R^5$-$R^8$ each independently represent a hydrogen atom, a phenyl group, a naphthyl group, a pyridyl group, a pyrimidinyl group, a pyridazinyl group, a pyrazinyl group, a furanyl group, a pyrrolyl group, a pyrazolyl group, an imidazolyl group, a thienyl group, or the like; and n represents an integer from 2 to 5.)

16 Claims, 5 Drawing Sheets

(51) Int. Cl.
  *H01L 51/50* (2006.01)
  *H01L 51/52* (2006.01)
  *C09D 7/12* (2006.01)
  *C08K 5/18* (2006.01)
  *C08K 5/42* (2006.01)

(52) U.S. Cl.
  CPC ...... *H01L 51/0021* (2013.01); *H01L 51/5056* (2013.01); *H01L 51/5088* (2013.01); *H01L 51/5237* (2013.01); *C08K 5/18* (2013.01); *C08K 5/42* (2013.01)

(56) References Cited

FOREIGN PATENT DOCUMENTS

| JP | 10-88123 A | 4/1998 |
|---|---|---|
| JP | 2002-151272 A | 5/2002 |
| JP | 2005-108828 A | 4/2005 |
| JP | 2010-225950 A | 10/2010 |
| JP | 2010-229280 A | 10/2010 |
| JP | 2010225950 A * | 10/2010 |
| WO | WO 2005/000832 A1 | 1/2005 |
| WO | WO 2006/025342 A1 | 3/2006 |
| WO | WO 2008/032616 A1 | 3/2008 |
| WO | WO 2010/058777 A1 | 5/2010 |
| WO | WO 2010058777 A1 * | 5/2010 |

OTHER PUBLICATIONS

Written Opinion of the International Search Authority, issued in PCT/JP2012/073602, dated Dec. 4, 2012.

Extended European Search Report issued Jul. 14, 2015, in European Patent Application No. 12833167.5.

* cited by examiner

CHARGE-TRANSPORTING VARNISH

TECHNICAL FIELD

The present invention relates to a charge-transporting varnish. More specifically, the invention relates to a charge-transporting varnish which is capable of providing an electrically conductive thin-film of excellent transparency.

BACKGROUND ART

The inventors earlier reported that a charge-transporting thin-film obtained from an organic solvent-based charge-transporting varnish which contains a charge-transporting material composed of a low-molecular-weight oligoaniline compound exhibits excellent electroluminescent device characteristics (see Patent Document 1).

In the charge-transporting varnish of Patent Document 1, the low-molecular-weight oligoaniline compound making up the charge-transporting material possesses within the molecule an identical repeating unit structure and has the property of becoming increasingly colored with extension of the conjugated system such that, when the varnish is rendered into a charge-transporting thin-film, light absorption in the visible wavelength spectrum increases.

Coloration of the charge-transporting thin-film is known to decrease the color purity and color reproducibility of an organic electroluminescent (abbreviated below as "organic EL") device.

Moreover, such coloration is a problem in various full-color technologies used in organic EL displays, such as tri-color emission, the color-by-white approach and color-changing methods, becoming a major obstacle to the stable production of organic EL devices.

Hence, there exists a desire for charge-transporting thin-films in organic EL devices to have a high transmittance in the visible wavelength spectrum and a high transparency.

In light of this, the inventors earlier found that a charge-transporting thin-film with suppressed coloration in the visible spectrum and excellent transparency can be obtained by using an oligoaniline compound wherein a portion of the conjugated system within the molecule has been cut or an oligoaniline compound which includes in some portion thereof a conjugated system composed of a structure of repeating units differing from aniline units (see Patent Document 2). However, a thin-film having an even higher transparency is now desired in order to enhance, for example, the light-extracting efficiency. Moreover, in organic EL devices which include the thin-film of Patent Document 2, there remains room for improvement in, for example, the device characteristics and lifespan.

PRIOR ART DOCUMENTS

Patent Documents

Patent Document 1: JP-A 2002-151272
Patent Document 2: International Disclosure WO 2008/032616
Patent Document 3: JP-A 10-088123

SUMMARY OF THE INVENTION

Problems to be Solved by the Invention

It is therefore an object of the present invention to provide a charge-transporting varnish that forms a charge-transporting thin-film which has a high transparency and is capable of eliciting good device characteristics when employed in an organic EL device.

Means for Solving the Problems

The inventors have conducted extensive investigations, as a result of which they have discovered that by using a diamine compound having a molecular structure which is unable to form a quinoid structure within the molecule, it is possible to obtain a charge-transporting thin-film of outstanding transparency. They have also found that a thin-film obtained from a charge-transporting varnish containing this diamine compound and an electron-accepting dopant exhibits a good electrical conductivity, enabling it to be advantageously used as a buffer layer in an organic EL device.

Although Patent Document 3 describes an organic EL device which uses N,N'-diphenylbenzidine as a hole-transporting material, no disclosure is made therein to the effect that a thin-film of excellent transparency can be obtained by using this compound.

Accordingly, the invention provides:
1. A charge-transporting varnish characterized by including an aryldiamine compound of formula (1)

[Chemical Formula 1]

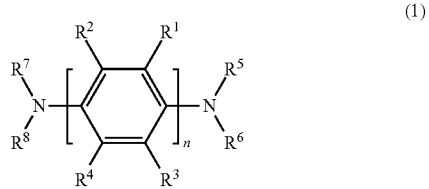

(1)

(wherein $R^1$ to $R^4$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons; $R^5$ to $R^8$ are each independently a hydrogen atom, a phenyl group, a naphthyl group, a pyridyl group, a pyrimidinyl group, a pyridazinyl group, a pyrazinyl group, a furanyl group, a pyrrolyl group, a pyrazolyl group, an imidazolyl group, a thienyl group (which groups may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons), or a group of formula (2), with the proviso that at least one of $R^5$ to $R^8$ is a hydrogen atom,

[Chemical Formula 2]

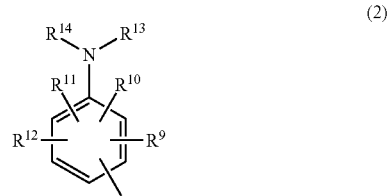

(2)

[Chemical Formula 3]

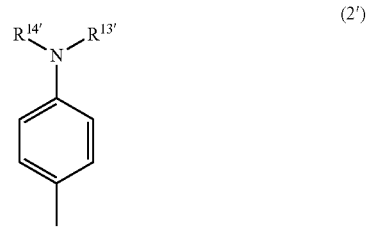

(2')

($R^9$ to $R^{12}$ being each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons; and $R^{13}$ and $R^{14}$ being each independently a phenyl group, a naphthyl group, an anthryl group, a pyridyl group, a pyrimidinyl group, a pyridazinyl group, a pyrazinyl group, a furanyl group, a pyrrolyl group, a pyrazolyl group, an imidazolyl group, a thienyl group (which groups may mutually bond to form a ring, and may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons)); and n is an integer from 2 to 5), an electron-accepting dopant substance, and a solvent;

2. The charge-transporting varnish according to 1 above, wherein $R^5$ and $R^7$ are hydrogen atoms; and $R^6$ and $R^8$ are each independently a phenyl group (which phenyl group may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons), or a group of formula (2);
3. The charge-transporting varnish according to 1 or 2 above, wherein $R^1$ to $R^4$ are each independently a hydrogen atom, a halogen atom, an alkyl group of 1 to 4 carbons, a perfluoroalkyl group of 1 to 4 carbons or an alkoxy group of 1 to 4 carbons; $R^5$ and $R^7$ are hydrogen atoms; and $R^6$ and $R^8$ are each independently a phenyl group or a group of formula (2')

(wherein $R^{13'}$ and $R^{14'}$ are each independently a phenyl group, a naphthyl group, an anthryl group or a biphenyl group (which groups may be substituted with a halogen atom, an alkyl group of 1 to 4 carbons, a perfluoroalkyl group of 1 to 4 carbons, or an alkoxy group of 1 to 4 carbons));
4. The charge-transporting varnish according to any of 1 to 3 above, wherein n is 2 or 3;
5. The charge-transporting varnish according to any one of 1 to 4 above, wherein the electron-accepting dopant substance includes an arylsulfonic acid compound;
6. The charge-transporting varnish according to any of 1 to 5 above, wherein the electron-accepting dopant substance is a combination of an arylsulfonic acid compound and a heteropolyacid compound;
7. The charge-transporting varnish according to 5 or 6 above, wherein the arylsulfonic acid compound has formula (3)

[Chemical Formula 4]

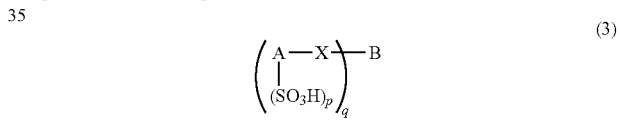

(3)

(wherein X is oxygen or sulfur; A is a naphthalene ring or anthracene ring which may have, as substituents other than X and a number p of ($SO_3H$) groups, one or more substituent selected from among halogen atoms, nitro groups, cyano groups, hydroxyl groups, thiol groups, phosphoric acid groups, sulfonic acid groups, carboxyl groups, alkoxy groups of 1 to 20 carbons, thioalkoxy groups of 1 to 20 carbons, alkyl groups of 1 to 20 carbons, haloalkyl groups of 1 to 20 carbons, cycloalkyl groups of 3 to 20 carbons, bicycloalkyl groups of 6 to 20 carbons, alkenyl groups of 2 to 20 carbons, alkynyl groups of 2 to 20 carbons, aryl groups of 6 to 20 carbons, aralkyl groups of 7 to 20 carbons and acyl groups of 1 to 20 carbons; B is a divalent or trivalent benzene ring, a divalent p-xylylene group, a divalent or trivalent naphthalene ring, a divalent to tetravalent perfluorobiphenyl group, or a divalent 2,2-bis((hydroxypropoxy) phenyl)propyl group; p is an integer from 1 to 4 that represents the number of sulfonic acid groups which bond to A; and q is an integer from 2 to 4 that represents the number of bonds between B and X;
8. The charge-transporting varnish according to 7 above, wherein X is oxygen and A is a naphthalene ring or an anthracene ring;
9. A charge-transporting thin-film produced from the charge-transporting varnish according to any of 1 to 8 above;
10. An organic electroluminescent device having a charge-transporting thin-film according to 9 above;

11. The organic electroluminescent device according to 10 above, wherein the charge-transporting thin-film is a hole injection layer or a hole transport layer;

12. A method of manufacturing an organic electroluminescent device, comprising the step of producing a charge-transporting thin-film using the charge-transporting varnish of 1 above;

13. The method of manufacturing an organic electroluminescent device according to 12 above, wherein the charge-transporting thin-film is a hole injection layer or a hole transport layer; and 14. The method of manufacturing an organic electroluminescent device according to 12 above, wherein the charge-transporting thin-film production step includes a film-forming step in which the charge-transporting varnish is applied to a substrate by spin coating, spraying, inkjet printing or slit coating.

Advantageous Effects of the Invention

A charge-transporting thin-film whose absorption of light in the visible wavelength spectrum is suppressed and which has a high transparency can be obtained using the charge-transporting varnish of this invention. By using this thin-film, the color reproducibility of a device can be ensured without lowering the color purity of electroluminescent light or light that has passed through a color filter, markedly helping to enhance light extraction efficiency from the emission layer to the exterior and making is it possible in turn to, for example, miniaturize organic EL devices and lower their driving voltage.

By using the charge-transporting varnish of the invention, a charge-transporting thin-film endowed with a high transparency and a electrical conductivity can be obtained. In particular, when this thin-film is employed as the charge injection layer in an organic EL device, it is possible to obtain an organic EL device having a high light-emitting efficiency and an excellent durability.

BRIEF DESCRIPTION OF THE DIAGRAMS

EMBODIMENT FOR CARRYING OUT THE INVENTION

Figure 1:
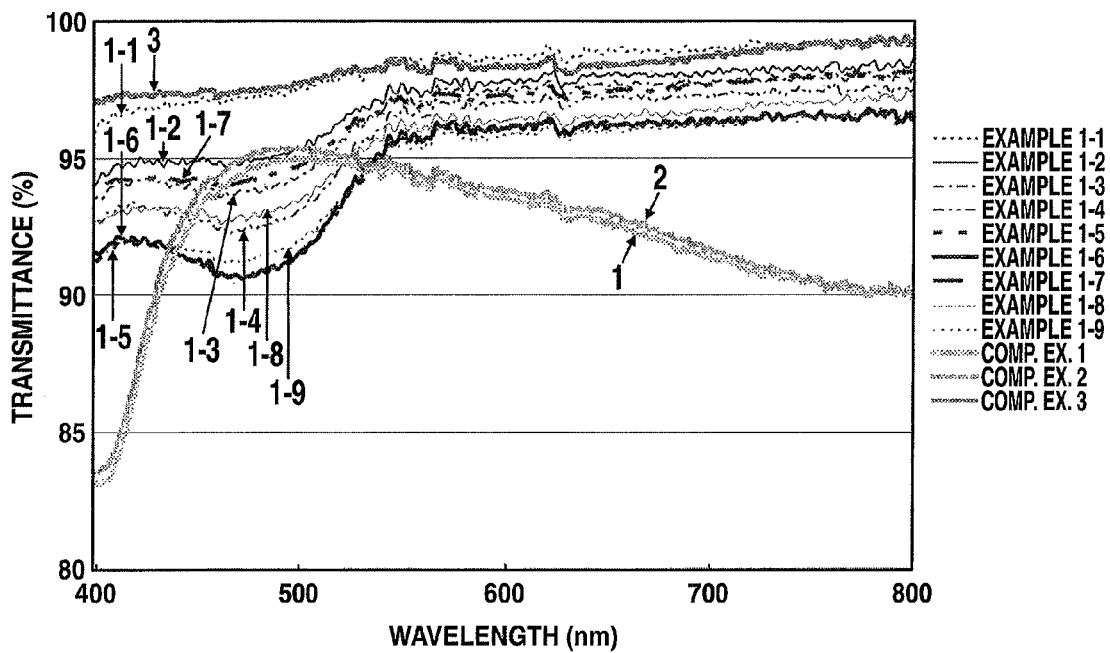
FIG. 1 is a graph showing the transmittances of the thin-films produced in Examples 1-1 to 1-9 and Comparative Examples 1 to 3.

The invention is described more fully below.

The charge-transporting varnish according to this invention includes an aryldiamine compound of above formula (1), an electron-accepting dopant substance, and a solvent.

Charge transportability refers here to hole transportability. The charge-transporting varnish of the invention may itself have charge transportability, or the solid film obtained using the varnish may have charge transportability.

In the aryldiamine compound of above formula (1), $R^1$ to $R^4$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons.

Here, examples of the halogen atom include fluorine, chlorine, bromine and iodine atoms.

Illustrative examples of the alkoxy group of 1 to 20 carbons include methoxy, ethoxy, n-propoxy, i-propoxy, c-propoxy, n-butoxy, i-butoxy, s-butoxy, t-butoxy, n-pentoxy, n-hexoxy, n-heptyloxy, n-octyloxy, n-nonyloxy, n-decyloxy, n-undecyloxy, n-dodecyloxy, n-tridecyloxy, n-tetradecyloxy, n-pentadecyloxy, n-hexadecyloxy, n-heptadecyloxy, n-octadecyloxy, n-nonadecyloxy and n-eicosanyloxy.

Illustrative examples of the thioalkoxy (alkylthio) group of 1 to 20 carbons include methylthio, ethylthio, n-propylthio, isopropylthio, n-butylthio, isobutylthio, s-butylthio, t-butylthio, n-pentylthio, n-hexylthio, n-heptylthio, n-octylthio, n-nonylthio, n-decylthio, n-undecylthio, n-dodecylthio, n-tridecylthio, n-tetradecylthio, n-pentadecylthio, n-hexadecylthio, n-heptadecylthio, n-octadecylthio, n-nonadecylthio and n-eicosanylthio.

Illustrative examples of the alkyl group of 1 to 20 carbons include methyl, ethyl, n-propyl, isopropyl, n-butyl, isobutyl, s-butyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, n-nonadecyl and n-eicosanyl.

The haloalkyl group of 1 to 20 carbons is exemplified by the foregoing alkyl group of 1 to 20 carbons in which at least one hydrogen atom has been substituted with a halogen atom. Of these, fluoroalkyl groups are preferred, and perfluoroalkyl groups are more preferred.

Illustrative examples include fluoromethyl, difluoromethyl, trifluoromethyl, pentafluoroethyl, 2,2,2-trifluoroethyl, heptafluoropropyl, 2,2,3,3,3-pentafluoropropyl, 2,2,3,3-tetrafluoropropyl, 2,2,2-trifluoro-1-(trifluoromethyl)ethyl, nonafluorobutyl, 4,4,4-trifluorobutyl, undecafluoropentyl, 2,2,3,3,4,4,5,5,5-nonafluoropentyl, 2,2,3,3,4,4,5,5-octafluoropentyl, tridecafluorohexyl, 2,2,3,3,4,4,5,5,6,6,6-undecafluorohexyl, 2,2,3,3,4,4,5,5,6,6-decafluorohexyl and 3,3,4,4,5,5,6,6,6-nonafluorohexyl.

Illustrative examples of the cycloalkyl group of 3 to 20 carbons include cyclopropyl, cyclobutyl, cyclopentyl, cyclohexyl, cycloheptyl, cyclooctyl and cyclononyl.

Illustrative examples of the bicycloalkyl group of 6 to 20 carbons include bicyclopropyl, bicyclobutyl, bicyclopentyl, bicyclohexyl, bicycloheptyl, bicyclooctyl and bicyclononyl.

Illustrative examples of the alkenyl group of 2 to 20 carbons include vinyl, 1-propenyl, 2-propenyl, 1-methyl-2-propenyl, 2-butenyl, 3-butenyl, 2-pentenyl, 3-pentenyl, 4-pentenyl, 2-hexenyl, 3-hexenyl, 4-hexenyl, 5-hexenyl, 6-heptenyl, 7-octenyl, 3,7-dimethyl-6-octenyl, 8-nonenyl, 9-decenyl, 10-undecenyl, 11-dodecenyl, 12-tridecenyl, 13-tetradecenyl, 14-pentadecenyl, 15-hexadecenyl, 16-heptadecenyl, 17-octadecenyl, 18-nonadecenyl and 19-eicosenyl.

Illustrative examples of the alkynyl group of 2 to 20 carbons include ethynyl, 1-propynyl, 2-propynyl, 1-methyl-2-propynyl, 2-butynyl, 3-butynyl, 2-pentynyl, 3-pentynyl, 4-pentynyl, 2-hexynyl, 3-hexynyl, 4-hexynyl, 5-hexynyl, 6-heptynyl, 7-octynyl, 3,7-dimethyl-6-octynyl, 8-nonynyl, 9-decynyl, 10-undecynyl, 11-dodecynyl, 12-tridecynyl, 13-tetradecynyl, 14-pentadecynyl, 15-hexadecynyl, 16-heptadecynyl, 17-octadecynyl, 18-nonadecynyl and 19-eicosynyl.

Illustrative examples of the aryl group of 6 to 20 carbons include phenyl, α-naphthyl, β-naphthyl, anthryl, phenanthrenyl, o-biphenylyl, m-biphenylyl and p-biphenylyl.

Illustrative examples of the aralkyl group of 7 to 20 carbons include benzyl, phenylethyl, phenylpropyl, naphthylmethyl, naphthylethyl and naphthylpropyl.

Illustrative examples of the acyl group of 1 to 20 carbons include formyl, acetyl, propionyl, butyryl, isobutyryl, valeryl, isovaleryl and benzoyl.

Of these, from the standpoint of increasing the transparency of the thin-film obtained and also increasing the characteristics of the organic EL device containing this thin-film, $R^1$ to $R^4$ are preferably hydrogen atoms, halogen atoms, alkyl groups of 1 to 4 carbons, perfluoroalkyl groups of 1 to 4 carbons or alkoxy groups of 1 to 4 carbons. Hydrogen atoms are more preferred.

$R^5$ to $R^8$ are each independently a hydrogen atom, a phenyl group, a naphthyl group, a pyridyl group, a pyrimidinyl group, a pyridazinyl group, a pyrazinyl group, a furanyl group, a pyrrolyl group, a pyrazolyl group, an imidazolyl group, a thienyl group (which groups may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons), or a group of above formula (2). At least one of $R^5$ to $R^8$ is a hydrogen atom.

In above formula (2), $R^9$ to $R^{12}$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons. $R^{13}$ and $R^{14}$ are each independently a phenyl group, a naphthyl group, an anthryl group, a pyridyl group, a pyrimidinyl group, a pyridazinyl group, a pyrazinyl group, a furanyl group, a pyrrolyl group, a pyrazolyl group, an imidazolyl group, a thienyl group (these groups may mutually bond to form a ring, and may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons).

In $R^5$ to $R^{14}$, the halogen atom, alkoxy group of 1 to 20 carbons, thioalkoxy group of 1 to 20 carbons, alkyl group of 1 to 20 carbons, haloalkyl group of 1 to 20 carbons, cycloalkyl group of 3 to 20 carbons, bicycloalkyl group of 6 to 20 carbons, alkenyl group of 2 to 20 carbons, alkynyl group of 2 to 20 carbons, aryl group of 6 to 20 carbons, aralkyl group of 7 to 20 carbons and acyl group of 1 to 20 carbons are exemplified by the same groups as mentioned above.

Of these, from the standpoint of increasing the solubility of the aryldiamine compound in a solvent and increasing the uniformity of the resulting thin-film, it is preferable for both $R^5$ and $R^7$ to be hydrogen atoms.

In formula (2'), $R^{13'}$ and $R^{14'}$ are each independently a phenyl group, a naphthyl group, an anthryl group or a biphenyl group (these groups may be substituted with a halogen atom, an alkyl group of 1 to 4 carbons, a perfluoroalkyl group of 1 to 4 carbons or an alkoxy group of 1 to 4 carbons, and are exemplified by the same groups as mentioned above).

Of these, from the standpoint of increasing the solubility of the aryldiamine compound in a solvent and increasing the uniformity of the resulting thin-film, it is preferable for $R^{13'}$ and $R^{14'}$ to be each independently a phenyl group or a naphthyl group, and it is more preferable for both to be a phenyl group.

With regard to combinations of the substituents described above, from the standpoint of increasing the transparency of the resulting thin-film and enhancing the characteristics of organic EL devices which include this thin-film, it is preferable for both $R^5$ and $R^7$ to be hydrogen atoms and for $R^6$ and $R^8$ to each be independently a phenyl group (which phenyl group may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons), or a group of above formula (2). It is more preferable for both $R^5$ and $R^7$ to be hydrogen atoms and for $R^6$ and $R^8$ to each be independently a phenyl group or a group of above formula (2') in which $R^{13'}$ and $R^{14'}$ are both phenyl groups. It is even more preferable for both $R^5$ and $R^7$ to be hydrogen atoms, and for both $R^6$ and $R^8$ to be phenyl groups.

In formula (1), "n" is an integer from 2 to 5. From the standpoint of such considerations as availability of the compound, and ease and cost of production, "n" is more preferably from 2 to 4. To increase the solubility in a solvent, "n" is even more preferably 2 or 3. Taking into account the balance among, for example, availability of the compound, ease and cost of production, solubility in a solvent, and transparency of the resulting thin-film, "n" is most preferably 2.

As for combinations of the various substituents described above with "n" to increase the transparency of the resulting thin-film and enhance the characteristics of organic EL devices which include this thin-film, it is preferable for both $R^5$ and $R^7$ to be hydrogen atoms, for $R^6$ and $R^8$ to each be independently a phenyl group (which phenyl group may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons or an acyl group of 1 to 20 carbons) or a group of above formula (2), and for "n" to be 2 or 3. It is more preferable for both $R^5$ and $R^7$ to be hydrogen atoms, for $R^6$ and $R^8$ to each be independently a phenyl group or a group of above formula (2') in which both $R^{13'}$ and $R^{14'}$ are phenyl groups, and for "n" to be 2. Taking into further consideration the availability of the compound, it is most preferable for both $R^5$ and $R^7$ to be hydrogen atoms, for both $R^6$ and $R^7$ to be phenyl groups, and for "n" to be 2.

Illustrative examples of aryldiamine compounds of above formula (1) include, but are not limited to, those shown below.

[Chemical Formula 5]

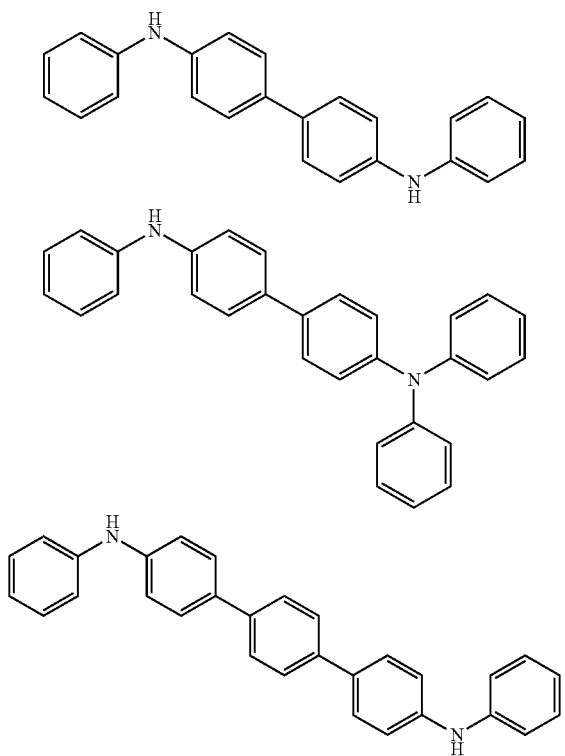

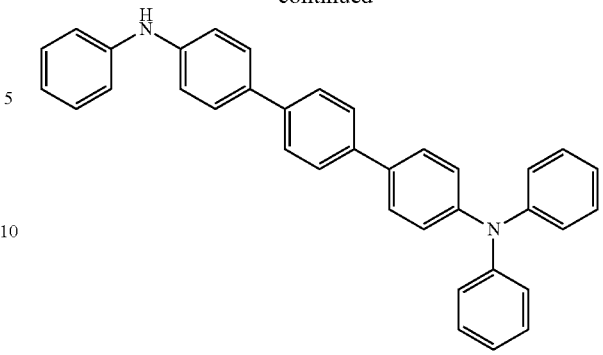

It is possible for these compounds to be commercial products or products synthesized by known methods using, for example, diaminobenzidine or diaminoterphenyl as the starting material. In either case, prior to preparing the charge-transporting varnish, it is preferable to use a product that has been purified by recrystallization, vapor deposition or the like.

By using a purified product, the characteristics of organic EL devices which include a thin-film obtained from the varnish can be enhanced.

When purification is carried out by recrystallization, the solvent used may be, for example, 1,4-dioxane or tetrahydrofuran.

The molecular weight of the aryldiamine compound of formula (1) is not particularly limited. However, from the standpoint of electrical conductivity, the lower limit is generally at least 200, and preferably at least 300. To increase solubility in a solvent, the upper limit is generally not more than 5,000, and preferably not more than 2,000.

In the charge-transporting varnish of the invention, a single compound selected from among aryldiamine compounds of formula (1) may be used alone as the compound of formula (1) (in which case, the dispersity in molecular weight is distribution is 1), or two or more compounds may be used in combination.

The electron-accepting dopant substance serving as the other ingredient used in the charge-transporting varnish of the invention is not particularly limited, provided it dissolves in at least one type of solvent used in the varnish.

Illustrative examples of the electron-accepting dopant substance include strong inorganic acids such as hydrochloric acid, sulfuric acid, nitric acid and phosphoric acid; Lewis acids such as aluminum(III) chloride ($AlCl_3$), titanium(IV) tetrachloride ($TiCl_4$), boron tribromide ($BBr_3$), a boron trifluoride-ether complex ($BF_4 \cdot OEt_2$), iron(III) chloride ($FeCl_3$), copper(II) chloride ($CuCl_2$), antimony(V) pentachloride ($SbCl_5$), arsenic(V) pentafluoride ($AsF_5$), phosphorus pentafluoride ($PF_5$) and tris(4-bromophenyl)aluminum hexachloroantimonate (TBPAH); strong organic acids such as benzenesulfonic acid, tosylic acid, camphorsulfonic acid, hydroxybenzenesulfonic acid, 5-sulfosalicylic acid, dodecylbenzenesulfonic acid, polystyrenesulfonic acid, the 1,4-benzodioxanedisulfonic acid compounds mentioned in International Disclosure WO 2005/000832, the arylsulfonic acid compounds mentioned in International Disclosure WO 2006/025342, and the dinonylnaphthalenesulfonic acid compounds mentioned in JP-A 2005-108828; and organic or inorganic oxidizing agents such as 7,7,8,8-tetracyanoquinodimethane (TCNQ), 2,3-dichloro-5,6-dicyano-1,4-benzoquinone (DDQ), iodine and heteropolyacids. Taking into consideration the balance between the transparency of the resulting thin-film and the characteristics of organic EL devices which include such a thin-film, an arylsulfonic acid is preferred, an arylsulfonic acid compound mentioned in International Disclosure WO 2006/025342 is more preferred, and an arylsulfonic acid compound of formula (3) above is still more preferred.

In formula (3), X is oxygen or sulfur, with oxygen being preferred.

"A" is a naphthalene ring or anthracene ring which may have, as substituents other than X and the number p of (SO$_3$H) groups, one or more substituent selected from among halogen atoms, nitro groups, cyano groups, hydroxyl groups, thiol groups, phosphoric acid groups, sulfonic acid groups, carboxyl groups, alkoxy groups of 1 to 20 carbons, thioalkoxy groups of 1 to 20 carbons, alkyl groups of 1 to 20 carbons, haloalkyl groups of 1 to 20 carbons, cycloalkyl groups of 3 to 20 carbons, bicycloalkyl groups of 6 to 20 carbons, alkenyl groups of 2 to 20 carbons, alkynyl groups of 2 to 20 carbons, aryl groups of 6 to 20 carbons, aralkyl groups of 7 to 20 carbons and acyl groups of 1 to 20 carbons. A naphthalene ring or an anthracene ring is especially preferred.

B is a divalent or trivalent benzene ring, a divalent p-xylylene group, a divalent or trivalent naphthalene ring, a divalent to tetravalent perfluorobiphenyl group, or a divalent 2,2-bis((hydroxypropoxy)phenyl)propyl group.

The substituents in A and B are exemplified by the same substituents as mentioned above.

In addition, "p" is an integer from 1 to 4 that represents the number of sulfonic acid groups which bond to A.

Also, "q" is an integer from 2 to 4 which represents the number of bonds between B and X.

From the standpoint of preventing the agglomeration of solids in the charge-transporting varnish while maintaining the characteristics of organic EL devices which include the resulting thin-film, it is preferable to use an arylsulfonic acid compound and a heteropolyacid together as the charge-accepting dopant substance.

The heteropolyacid compound is a polyacid which has a structure wherein a heteroatom is positioned at the center of the molecule—typically of the Keggin-type chemical structure shown in formula (A) or the Dawson-type chemical structure shown in formula (B), and which is obtained by the condensation of an isopolyacid which is an oxo acid of vanadium (V), molybdenum (Mo), tungsten (W) or the like with an oxo acid of a different element.

Examples of this oxo acid of another element include primarily oxo acids of silicon (Si), phosphorus (P) and arsenic (As).

[Chemical Formula 6]

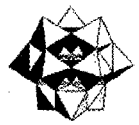

(A)

(B)

Illustrative examples of the heteropolyacid compound include phosphomolybdic acid, silicomolybdic acid, phosphotungstic acid, phosphotungstomolybdic acid and silicotungstic acid. Taking into account the characteristics of organic EL devices which include the resulting thin-films, phosphomolybdic acid, phosphotungstic acid and silicotungstic acid are preferred, and phosphotungstic acid is more preferred.

These heteropolyacid compounds may be prepared by a known synthesis method and used, or are available as commercial products. For example, phosphotungstic acid (also known as phosphotungstic acid hydrate or 12 tungstophosphoric acid n-hydrate, and having the chemical formula $H_3(PW_{12}O_{40}).nH_2O$), and phosphomolybdic acid (also known as phosphomolybdic acid hydrate or 12 molybdo (VI) phosphoric acid n-hydrate, and having the chemical formula $H_3(PMo_{12}O_{40}).nH_2(O)$ (where n≈30)) are available from manufacturers such as Kanto Chemical Co., Ltd., Wako Pure Chemical Industries, Ltd., Sigma-Aldrich Japan, Nippon Inorganic Colour & Chemical Co., Ltd. and Japan New Metals Co., Ltd.

Taking into account both the balance between the transparency of the thin-film obtained and the characteristics of organic EL devices having such a thin-film and also the availability of the compounds, the combination of the solids (charge-transporting substance and electron-accepting dopant substance) making up the charge-transporting varnish of the invention is preferably a combination of N,N'-diphenylbenzidine (here and below, the charge-transporting substance) and an arylsulfonic acid compound (here and below, the electron-accepting dopant substance). A combination of N,N'-diphenylbenzidine with the arylsulfonic acid compound of formula (3) is more preferred.

In addition, from the standpoint of preventing the agglomeration of solids and reproducibly producing thin-films of high planarity, a combination of N,N'-diphenylbenzidine with an electron-accepting dopant made up of two components—an arylsulfonic acid compound which is preferably an arylsulfonic acid compound of formula (3) and a heteropolyacid which is preferably phosphotungstic acid—is more preferred.

When an arylsulfonic acid compound is used as the electron-accepting dopant substance, the amount of the electron-accepting dopant substance, expressed as a molar ratio, is generally from 0.1 to 10 mole per mole of the charge-transporting substance. From the standpoint of reproducibly obtaining a thin-film of high transparency, this molar ratio is preferably from 0.5 to 1.5.

In cases where a heteropolyacid is used together with an arylsulfonic acid compound as the electron-accepting dopant substance, from the standpoint of reproducibly obtaining a thin-film of high transparency, the weight ratio of the electron-accepting dopant substance (the sum of the weight of the arylsulfonic acid compound and the weight of phosphotungstic acid) with respect to a value of 1 for the charge-transporting substance is preferably from 1.0 to 4.0, and more preferably from 1.5 to 3.5. In these weight ratio conditions between the charge-transporting substance and the electron-accepting dopant substance, from the standpoint of reproducibly manufacturing organic EL devices having excellent emission characteristics, in the electron-accepting dopant substance, the ratio by weight of arylsulfonic acid with respect to a value of 1 for the heteropolyacid, is preferably from 0.2 to 6.0, more preferably from 0.25 to 5.0, and even more preferably from 0.3 to 3.0.

The solvent used when preparing the charge-transporting varnish may be a high-solvency solvent in which the diarylamine compound and the electron-accepting dopant substance can dissolve well. Illustrative examples of such high-solvency solvents that may be used include organic solvents such as N,N-dimethylformamide, N,N-dimethylacetamide, N-methylpyrrolidone, 1,3-dimethyl-2-imidazolidinone and diethylene glycol monomethyl ether. These solvents may be used singly or two or more may be used in admixture. The amount of use may be set to from 5 to 100 wt % of the overall solvent used in the varnish.

It is preferable for both the diarylamine compound and the electron-accepting dopant substance to be either completely dissolved, or in a uniformly dispersed state, within the solvent.

Moreover, by including in the charge-transporting varnish of the invention at least one high-viscosity organic solvent having a viscosity at 20° C. of from 10 to 200 mPa·s, and especially a viscosity of 35 to 150 mPa·s, and having a boiling point at standard pressure of from 50 to 300° C., and especially from 150 to 250° C., adjusting the viscosity of the varnish is easy, thin-films of high planarity are reproducibly provided, and the varnish can be easily modified according to the coating method used.

Illustrative examples of high-viscosity organic solvents include, but are not particularly limited to, cyclohexanol, ethylene glycol, ethylene glycol diglycidyl ether, 1,3-octylene glycol, diethylene glycol, dipropylene glycol, triethylene glycol, tripropylene glycol, 1,3-butanediol, 2, 3-butanediol, 1,4-butanediol, propylene glycol and hexylene glycol.

The amount of high-viscosity organic solvent added as a proportion of the overall solvent used in the varnish of the invention is preferably within a range where no precipitation of solids occurs. To the extent that solids do not precipitate, the amount of such addition is preferably from 5 to 80 wt %.

In addition, another solvent may be admixed in a proportion with respect to the overall solvent used in the varnish of from 1 to 90 wt %, and preferably 1 to 50 wt %, for the purposes of, for example, enhancing the substrate wettability, adjusting the solvent surface tension, adjusting the solvent polarity, and adjusting the boiling point of the solvent.

Examples of such solvents include, but are not limited to, ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, diethylene glycol monoethyl ether, diacetone alcohol, γ-butyrolactone, ethyl lactate and n-hexyl acetate. These solvents may be used singly or two or more may be used in admixture.

By coating the above-described charge-transporting varnish onto a substrate and evaporating off the solvent, a charge-transporting thin-film can be formed on the substrate.

Examples of the varnish coating method include, but are not particularly limited to, dipping, spin coating, transfer printing, roll coating, brush coating, inkjet printing and spraying.

Examples of methods for evaporating the solvent include, but are not particularly limited to, evaporation using a hot plate or oven in a suitable atmosphere, such as in open air, in an inert gas such as nitrogen, or in a vacuum. It is possible in this way to obtain a thin-film having a uniform film surface.

Although the firing temperature is not subject to any particular limitation so long as the solvent can be evaporated off, a firing temperature of from 40 to 250° C. is preferred. In this case, a temperature change in two or more steps may be applied for such purposes as to manifest a more uniform film formability or to induce the reaction to proceed on the substrate.

The thickness of the charge-transporting thin-film is not particularly limited; when used as a charge injection layer in an organic EL device, a film thickness of from 5 to 200 nm is preferred. Methods of varying the film thickness include varying the solids concentration in the varnish, and varying the amount of solution on the substrate during coating.

Examples of the materials and method used to fabricate OLEDs using the charge-transporting varnish of the invention include, but are not limited to, those mentioned below.

The electrode substrate used is preferably cleaned by carrying out liquid cleaning beforehand with a cleaning agent, alcohol, pure water or the like. For example, in the case of a positive electrode substrate, it is preferable to carry out surface treatment such as UV/ozone treatment or oxygen-plasma treatment just prior to use. However, in cases where the positive electrode material is composed primarily of an organic substance, surface treatment need not be carried out.

In cases where the charge-transporting varnish of the invention is used in OLEDs as a hole-transporting varnish, the method employed is exemplified by the following.

A hole-transporting thin-film is fabricated on the electrode by coating the hole-transporting varnish onto the positive electrode substrate, then carrying out evaporation and firing by the above methods. This thin-film is introduced into a vacuum deposition system and a hole transport layer, emission layer, electron transport layer, electron injection layer and negative electrode metal are vapor-deposited in this order to form an OLED. Carrier block layers may be provided to desired layer intervals so as to control the light-emitting region.

Illustrative examples of the positive electrode material include transparent electrodes such as indium-tin oxide (ITO) and indium-zinc oxide (IZO). A positive electrode material on which planarizing treatment has been carried out is preferred. Use can also be made of polythiophene derivatives and polyaniline derivatives having a high charge-transporting ability.

Illustrative examples of the hole transport layer-forming material include triarylamines such as (triphenylamine) dimer derivatives (TPD), (α-naphthyldiphenylamine) dimer (α-NPD) and [(triphenylamine) dimer] spirodimer (Spiro-TAD); starburst amines such as 4,4',4"-tris[3-methylphenyl(phenyl)amino]triphenylamine (m-MTDATA) and 4,4',4"-tris[1-naphthyl(phenyl)amino]-triphenylamine (1-TNATA); and oligothiophenes such as 5,5"-bis-{4-[bis(4-methylphenyl)amino]phenyl}-2,2':5',2"-terthiophene (BMA-3T).

Illustrative examples of the emission layer-forming material include tris(8-quinolinolate) aluminum(III) ($Alq_3$), bis(8-quinolinolate) zinc(II) ($Znq_2$), bis(2-methyl-8-quinolinolate)(p-phenylphenolate) aluminum(III) (BAlq) and 4,4'-bis(2,2-diphenylvinyl)biphenyl (DPVBi). It is also possible to form the emission layer by the co-vapor deposition of an electron-transporting material or hole-transporting material with a light-emitting dopant.

Illustrative examples of the electron-transporting material include $Alq_3$, BAlq, DPVBi, (2-(4-biphenyl)-5-(4-t-butylphenyl)-1,3,4-oxadiazole) (PBD), triazole derivatives (TAZ), bathocuproin (BCP) and silole derivatives.

Illustrative examples of light-emitting dopants include quinacridone, rubrene, coumarin 540, 4-(dicyanomethylene)-2-methyl-6-(p-dimethylaminostyryl)-4H-pyran (DCM), tris(2-phenylpyridine) iridium(III) (Ir(ppy)$_3$) and (1,10-phenanthroline)tris(4,4,4-trifluoro-1-(2-thienyl)-butane-1,3-dionate) europium(III) (Eu(TTA)$_3$phen).

Illustrative examples of the carrier block layer-forming material include PBD, TAZ and BCP.

Illustrative examples of the electron injection layer-forming material include lithium oxide (Li$_3$O), magnesium oxide (MgO), alumina (Al$_2$O$_3$), lithium fluoride (LiF), magnesium fluoride (MgF$_2$), strontium fluoride (SrF$_2$), Liq, Li(acac), lithium acetate and lithium benzoate.

Illustrative examples of the negative electrode material include aluminum, magnesium-silver alloys, aluminum-lithium alloys, lithium, sodium, potassium and cesium.

The method of fabricating polymer LEDs (PLEDs) using the charge-transporting varnish of the invention, although not particularly limited, is exemplified by the following method.

Instead of carrying out vacuum deposition operations for the hole transport layer, emission layer, electron transport layer and electron injection layer in the above-described OLED fabrication process, a PLED which includes a charge-transporting thin-film formed using the charge-transporting varnish of the invention can be fabricated by forming a light-emitting charge-transporting polymer layer.

Specifically, a charge-transporting varnish (hole-transporting varnish) is coated onto a positive electrode substrate, producing a hole-transporting thin-film by the above method. A light-emitting charge-transporting polymer layer is then formed on top thereof, and a negative electrode is vapor deposited on the polymer layer to form a PLED.

The negative electrode and positive electrode materials used here may be similar to those used when fabricating OLEDs as described above, and similar cleaning treatment and surface treatment may be carried out.

An example of the method of forming the light-emitting charge-transporting polymer layer is a film-forming method in which a light-emitting charge-transporting polymer material, or a material obtained by adding thereto a light-emitting dopant, is dissolved or uniformly dispersed by the addition of a solvent, the resulting solution or dispersion is coated onto an electrode substrate having a hole injection layer formed thereon, and the solvent is subsequently removed by evaporation.

Illustrative examples of light-emitting charge-transporting polymer materials include polyfluorene derivatives such as poly(9,9-dialkylfluorene) (PDAF), polyphenylenevinylene derivatives such as poly(2-methoxy-5-(2'-ethylhexoxy)-1,4-phenylenevinylene) (MEH-PPV), polythiophene derivatives such as poly(3-alkylthiophene) (PAT), and polyvinylcarbazole (PVCz).

Illustrative examples of the solvent include toluene, xylene and chloroform. Examples of the method of dissolution or uniform dispersion include stirring, stirring under applied heat, and ultrasonic dispersion.

Examples of the coating method include, but are not particularly limited to, inkjet printing, spraying, dipping, spin coating, transfer printing, roll coating and brush coating. Coating is preferably carried out in an inert gas atmosphere such as nitrogen or argon.

Examples of the solvent evaporation method include methods that involve heating in an oven or on a hot plate within an inert gas atmosphere or a vacuum.

EXAMPLES

Working Examples and Comparative Examples are given below to more concretely illustrate the invention, although the invention is not limited by these Examples.

In the Examples below, a substrate cleaning system (reduced-pressure plasma system) manufactured by Choshu Industry Co., Ltd. was used for substrate cleaning, an MS-A100 spin coater manufactured by Mikasa Corporation was used for varnish coating, a Surfcorder ET-4000 microfigure measuring instrument manufactured by Kosaka Laboratory, Ltd. was used to measure the film thickness, and a UV-3100PC UV-visible absorption spectrophotometer manufactured by Shimadzu Corporation was used to measure the transmittance.

In addition, the C-E2L1G1-N multifunction vapor deposition system manufactured by Choshu Industry Co., Ltd. was used to fabricate OLEDs, the I-V-L measurement system manufactured by Tech World, Inc. was used to measure the luminance and other device characteristics of the OLEDs, and the PEL-105S organic EL luminance life evaluation system manufactured EHC K.K. was used to measure the lifetimes of the OLEDs.

[1] Charge-Transporting Varnish and Charge-Transporting Thin-Film Production, and Evaluation of Thin-Film Transparency Synthesis Example 1

The NSO-2 used in the working examples of the invention and the comparative examples was synthesized by the following reaction, based on the description provided in International Disclosure WO 2006/025342.

[Chemical Formula 7]

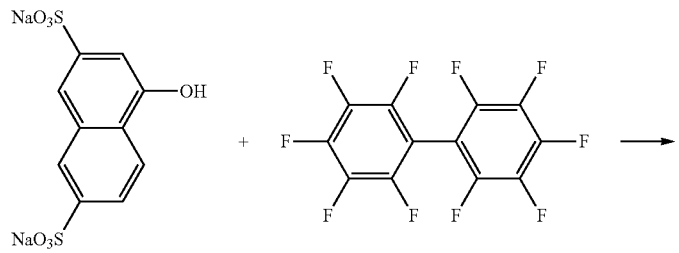

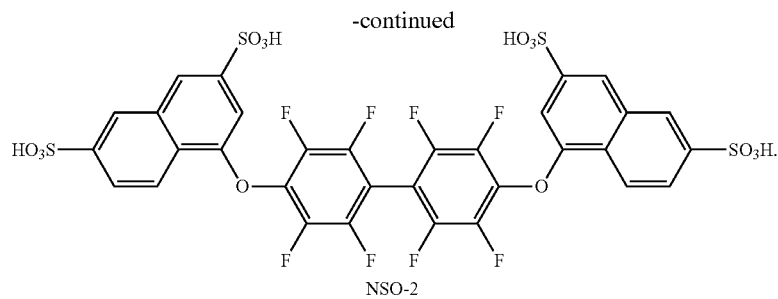

NSO-2

That is, 4.797 g (14.36 mmol) of perfluorobiphenyl, 4.167 g (30.15 mmol) of potassium carbonate and 100 mL of N,N-dimethylformamide were successively added to 11 g (31.59 mmol) of thoroughly dried sodium 1-naphthol-3,6-disulfonate, and the reaction system was flushed with nitrogen, following which the mixture was stirred for six hours at an internal temperature of 100° C.

The system was allowed to cool to room temperature, then an additional 500 mL of N,N-dimethylformamide was added and stirring at room temperature was carried out for 90 minutes so as to re-dissolve the NSO-2 that had precipitated out following the reaction. After stirring at room temperature, this solution was filtered to remove potassium carbonate residues, then concentrated under reduced pressure. In addition, 100 mL of methanol was added to the residues and room temperature stirring was carried out in order to remove remaining impurities. After 30 minutes of stirring at room temperature, the suspension was filtered and the filtered matter was collected. The filtered matter was then dissolved by adding thereto 300 mL of ultrapure water, and the resulting solution was ion-exchanged by column chromatography using Dowex 650C cation-exchange resin (from Dow Chemical; about 200 mL of H-type; distillation solvent: ultrapure water).

The fraction at or below pH 1 was concentrated to dryness and the residue was dried to hardness in vacuo, giving 11 g of a yellow powder (yield, 85%).

Comparative Synthesis Example 1

The N,N'-di(1-n-butyl)-N,N'-diphenylbenzidine (DPBZ-C4) used in the comparative examples was synthesized by the following reaction.

[Chemical Formula 8]

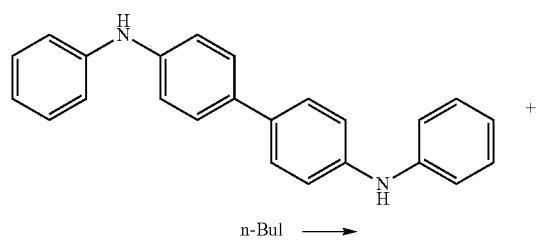

n-BuI ⟶

-continued

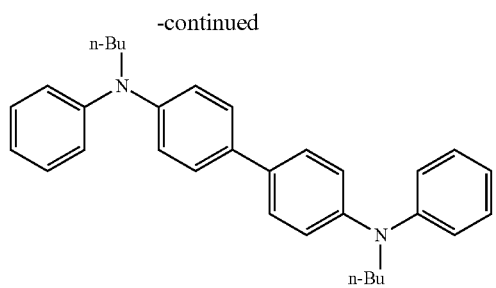

(n-Bu—— = CH₃CH₂CH₂CH₂——)

In a nitrogen-flushed reaction vessel, 50 mL of N,N-dimethylformamide was added to 5.0 g of N,N'-diphenylbenzidine (abbreviated below as "DPBZ"; from Tokyo Chemical Industry Co., Ltd.). To this was added 2.6 g of sodium hydride (60% purity, from Wako Pure Chemical Industries Co., Ltd.), and the vessel contents were stirred for 10 minutes at room temperature. Next, 13 g of 1-iodobutane was added dropwise and the contents were stirred for 19 hours at room temperature, following which a mixed solvent of isopropyl alcohol and toluene was added to stop the reaction.

Liquid-liquid extraction was then carried out using ion-exchanged water, and the resulting organic phase was concentrated by evaporating off the solvent. Activated carbon and toluene were added to the concentrate and 30 minutes of stirring was carried out at 50° C., following which the activated carbon was removed by filtration and the solvent was removed by evaporation from the filtrate. The resulting solid was dried in vacuo. n-Hexane was added thereto and slurry washing was carried out, following which the washed solid was again dried in vacuo, giving 4.3 g of a powder (yield, 65%).

$^1$H-NMR (300 MHz, CDCl$_3$) δ 7.45 (d, J=8.4 Hz, 4H), 7.24-7.29 (m, 4H), 6.92-7.04 (m, 10H), 3.71 (t, J=7.5 Hz, 4H), 1.62-1.73 (m, 4H), 1.32-1.44 (m, 4H), 0.93 (t, J=7.5 Hz, 6H).

Example 1-1

The N,N'-diphenylbenzidine (abbreviated below as "DPBZ"; from Tokyo Chemical Industry Co., Ltd.) of formula [1] below was recrystallized from 1,4-dioxane, then thoroughly dried in vacuo. Next, 0.244 g (0.726 mmol) of the vacuum-dried DPBZ and 0.246 g (0.272 mmol) of NSO-2 were dissolved in 8 g of 1,3-dimethyl-2-imidazolidinone (abbreviated below as "DMI") under a nitrogen atmosphere. Then 12 g of cyclohexanol (CHA) and 4 g of propylene glycol (PG) were added to the resulting solution, followed by stirring, thereby preparing a charge-transporting varnish (solids content, 2.0 wt %).

The resulting varnish was coated onto a quartz substrate with a spin coater, then dried at 50° C. for 5 minutes in open air and baked at 230° C. for 15 minutes, thereby forming a uniform thin-film having a thickness of 30 nm on the quartz substrate.

Here and in the examples that follow, quartz substrates were used after removing impurities on the surface with a plasma cleaning system (150 W, 30 seconds).

[Chemical Formula 9]

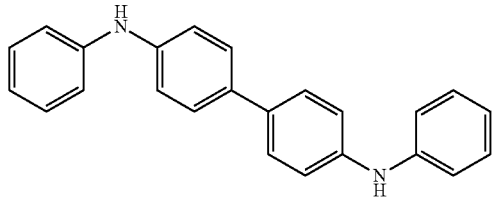

[1]

Example 1-2

Aside from setting the amount of DPBZ used to 0.163 g (0.485 mmol) and using 0.229 g (0.253 mmol) of NSO-2 and 0.098 g (0.034 mmol) of phosphotungstic acid (Kanto Chemical Co., Ltd.) instead of 0.246 g of NSO-2, a uniform thin-film having a thickness of 30 nm was formed on a quartz substrate by the same method as in Example 1-1.

Examples 1-3 to 1-6

Aside from setting the amounts of NSO-2 and phosphotungstic acid used to respectively 0.196 g (0.217 mmol) and 0.131 g (0.045 mmol) in Example 1-3, 0.163 g (0.181 mmol) and 0.163 g (0.057 mmol) in Example 1-4), 0.131 g (0.145 mmol) and 0.196 g (0.068 mmol) in Example 1-5, and 0.098 g (0.109 mmol) and 0.229 g (0.079 mmol) in Example 1-6), uniform thin-films having thicknesses of 30 nm were formed on quartz substrates by the same method as in Example 1-2.

Examples 1-7 to 1-9

Aside from setting the amounts of DPBZ, NSO-2 and phosphotungstic acid used to respectively 0.122 g (0.364 mmol), 0.184 g (0.203 mmol) and 0.184 g (0.064 mmol) in Example 1-7, 0.122 g (0.364 mmol), 0.147 g (0.163 mmol) and 0.220 g (0.077 mmol) in Example 1-8, and 0.122 g (0.364 mmol), 0.110 g (0.122 mmol) and 0.257 g (0.089 mmol) in Example 1-9, uniform thin-films having thicknesses of 30 nm were formed on quartz substrates by the same method as in Example 1-2.

Comparative Example 1

The following were completely dissolved in 18 g of DMI under a nitrogen atmosphere: 0.185 g (0.338 mmol) of the bis(4-diphenylamino)-2,2'-dimethyl-4,4'-diaminobiphenyl (abbreviated below as "BDDMD") of formula [2] below synthesized by the method described in International Disclosure WO 2008/032616, and 0.305 g (0.338 mmol) of NSO-2. Next, 12 g of CHA and 4 g of PG were added to the resulting solution, followed by stirring, thereby giving a charge-transporting varnish (solids content, 2.0 wt %).

The resulting varnish was coated onto a quartz substrate with a spin coater, then dried and baked in the same way as in Example 1-1, thereby forming a uniform thin-film having a thickness of 30 nm on the quartz substrate.

[Chemical Formula 10]

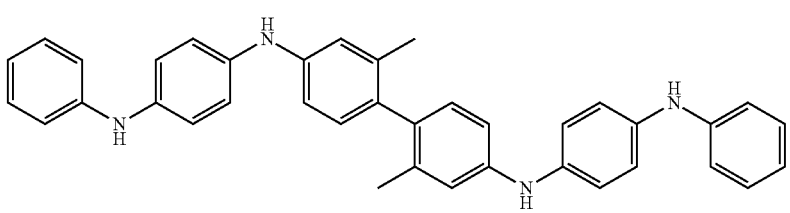

[2]

Comparative Example 2

The (4-diphenylamino)-4,4'-diaminodiphenyl ether (abbreviated below as "BDDE") of formula [3] below synthesized by the method described in International Disclosure WO 2008/032616 and 0.308 g (0.341 mmol) of NSO-2 were completely dissolved in 8 g of DMI under a nitrogen atmosphere. Next, 12 g of CHA and 4 g of PG were added to the resulting solution, followed by stirring, thereby preparing a charge-transporting varnish (solids content, 2.0 wt %).

The resulting varnish was coated onto a quartz substrate with a spin coater, then dried and baked in the same way as in Example 1-1, thereby forming a uniform thin-film having a thickness of 30 nm on the quartz substrate.

[Chemical Formula 11]

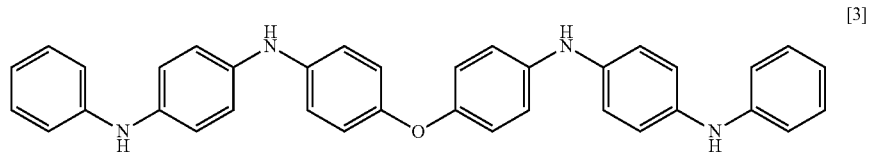

Comparative Example 3

The following were dissolved in 8 g of DMI under a nitrogen atmosphere: 0.279 g (0.622 mmol) of the DPBZ-C4 of formula [4] synthesized in Comparative Synthesis Example 1 and 0.211 g (0.233 mmol) of NSO-2. Next, 12 g of CHA and 4 g of PG were added to the resulting solution, followed by stirring, thereby preparing a charge-transporting varnish (solids content, 2.0 wt %).

The resulting varnish was coated onto a quartz substrate with a spin coater, then dried and baked in the same way as in Example 1-1, thereby forming a uniform thin-film having a thickness of 30 nm on the quartz substrate.

[Chemical Formula 12]

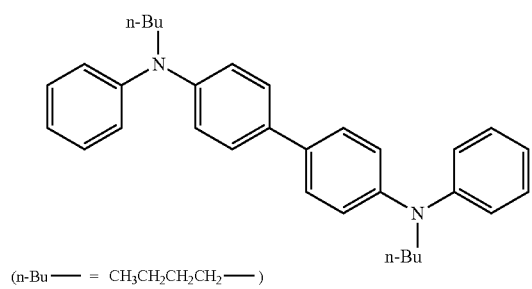

(n-Bu—— = CH$_3$CH$_2$CH$_2$CH$_2$——)

Figure 2:
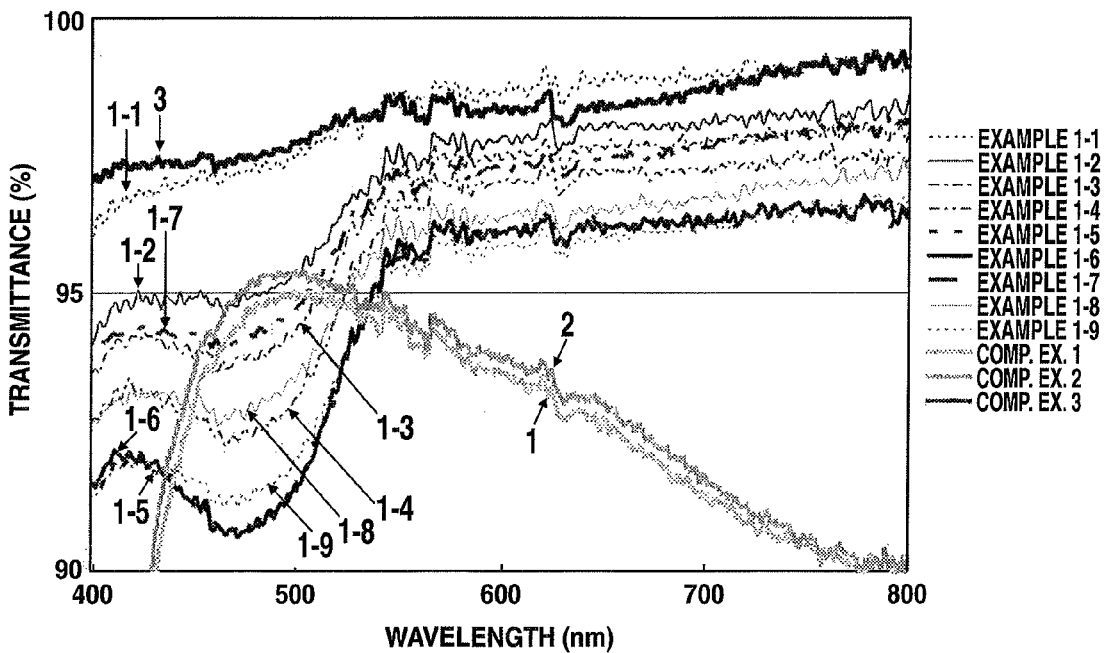
FIG. 2 is an enlarged view of the 90 to 100% transmittance portion in FIG. 1.

The transmittances of the thin-films produced in above Examples 1-1 to 1-9 and Comparative Examples 1 to 3 were measured. The transmittances were obtained by scanning the visible spectrum; i.e., wavelengths of from 400 to 800 nm. The results are shown in FIGS. 1 and 2. Table 1 shows the respective transmittances at 400, 500, 600, 700 and 800 nm, and also the average transmittances at from 400 to 800 nm.

TABLE 1

|  | @ 400 nm (%) | @ 500 nm (%) | @ 600 nm (%) | @ 700 nm (%) | @ 800 nm (%) | Average transmittance (%) |
| --- | --- | --- | --- | --- | --- | --- |
| Example 1-1 | 96 | 97 | 99 | 99 | 99 | 98 |
| Example 1-2 | 94 | 95 | 98 | 98 | 99 | 97 |
| Example 1-3 | 94 | 94 | 97 | 98 | 98 | 97 |
| Example 1-4 | 93 | 93 | 97 | 97 | 97 | 96 |
| Example 1-5 | 91 | 91 | 96 | 96 | 96 | 95 |
| Example 1-6 | 92 | 92 | 96 | 96 | 96 | 95 |
| Example 1-7 | 94 | 95 | 97 | 98 | 98 | 97 |
| Example 1-8 | 93 | 93 | 96 | 97 | 97 | 96 |
| Example 1-9 | 91 | 92 | 96 | 96 | 97 | 95 |
| Comparative Example 1 | 83 | 95 | 94 | 91 | 90 | 92 |
| Comparative Example 2 | 84 | 95 | 94 | 92 | 90 | 92 |
| Comparative Example 3 | 97 | 98 | 98 | 99 | 99 | 98 |

As shown in FIGS. 1 and 2 and Table 1, in the visible spectrum, the thin-films produced in Examples 1-1 to 1-9 had higher transmittances than the thin-films produced in Comparative Examples 1 and 2.

The reason for the improvement in transparency appears to be due to the fact that the DPBZ included in the thin-films of the working examples does not adopt the quinoid structure which can be adopted by the BDDMD and the BDDE used in Comparative Examples 1 and 2 and which is thought to cause a decrease in transparency.

This is suggested as well by the fact that the thin-film produced using DPBZ-C6 (in Comparative Example 3), which has a structure very similar to that of DPBZ and likewise does not adopt a quinoid structure, has a high transparency.

As used herein, "quinoid structure" refers to a structure which has one less double bond in the carbon ring of an aromatic compound and has instead two exocyclic double bonds at para or ortho positions. For example, in the case of an aryldiamine compound having two amino groups at mutually para positions, this is a structure like that shown in formula [5] below.

[Chemical Formula 13]

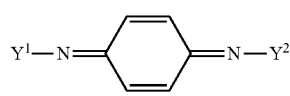

(wherein $Y^1$ and $Y^2$ are each any substituent)

[2] Evaluation of Electrical Characteristics of Charge-Transporting Thin-Films

A 25 mm×25 mm×0.7(t) mm glass substrate with indium-tin oxide patterned on the surface thereof to a film thickness of 150 nm (which substrate is abbreviated below as an "ITO substrate") was used as the substrate for evaluating the electrical characteristics. The ITO substrate was used after removing impurities on the surface with an O$_2$ plasma cleaning system (150 W, 30 seconds).

Example 2-1

The varnish obtained in Example 1-1 was coated onto an ITO substrate with a spin coater, then dried at 50° C. for 5 minutes and baked at 230° C. for 15 minutes, thereby forming a 30 nm uniform thin-film on the ITO substrate.

Next, using a vapor deposition system, an aluminum thin-film was formed on the ITO substrate having a thin-film formed thereon, thereby giving a single-layer device. The film thickness of the aluminum thin-film was set to 120 nm, and vapor deposition was carried out under a vacuum of $1.3 \times 10^{-3}$ Pa and at a vapor deposition rate of 0.2 nm/s.

To prevent the device characteristics from deteriorating due to the influence of oxygen, water and the like in air, the single-layer device was sealed with sealing substrates, following which the characteristics were evaluated. Sealing was carried out by the following procedure.

The single-layer device was placed between sealing substrates in a nitrogen atmosphere having an oxygen to concentration of 2 ppm or less and a dew point of not more than −85° C., and the sealing substrates were laminated together using an adhesive. At this time, a humectant (HD-071010W-40, from Dynic Corporation) was placed, together with the single-layer device, within the sealing substrates. The adhesive used was XNR5516Z-B1, from Nagase ChemteX Corporation.

The laminated sealing substrates were irradiated with UV light (wavelength, 365 nm; dosage, 6,000 mJ/cm$^2$), then annealed at 80° C. for 1 hour to cure the adhesive.

Comparative Examples 4 and 5

Aside from using the varnishes obtained in, respectively, Comparative Examples 1 and 2, single-layer devices were produced by the same method as in Example 2-1.

Figure 3:
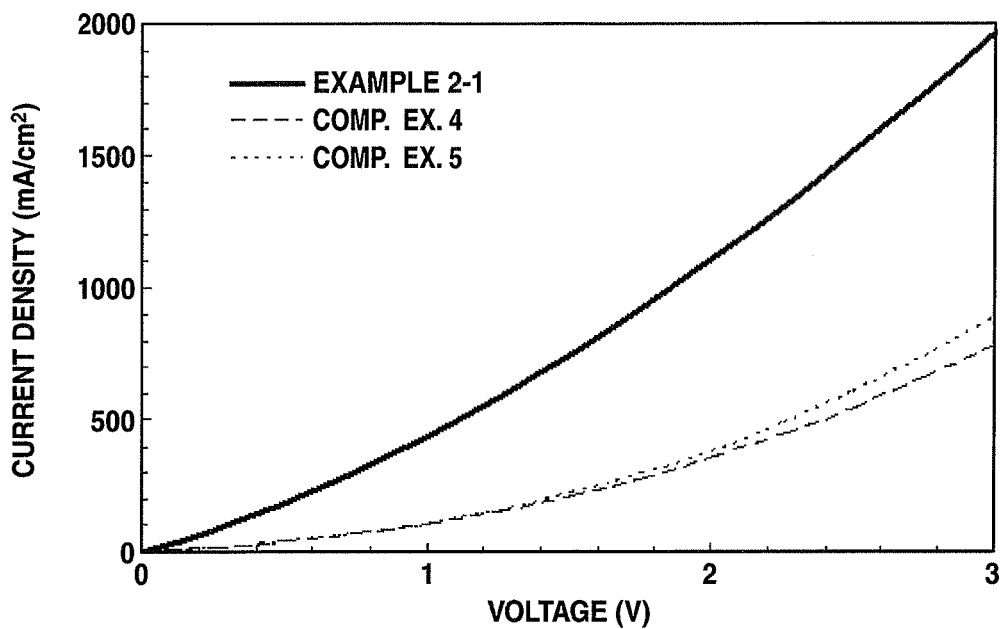
FIG. 3 is a graph showing the voltage-current density characteristics for the single-layer devices produced in Example 2-1 and Comparative Examples 4 and 5.

Measurement of the current density was carried out on the single-layer devices produced in Example 2-1 and Comparative Examples 4 and 5. FIG. 3 shows a graph of voltage versus current density for these examples, and Table 2 shows the current densities at a driving voltage of 3 V.

TABLE 2

| | Current density (mA/cm$^2$) |
|---|---|
| Example 2-1 | 1,960 |
| Comparative Example 4 | 770 |
| Comparative Example 5 | 890 |

As shown in FIG. 3 and Table 2, it is apparent that the single-layer device of Example 2-1 has a higher current density than the single-layer devices in Comparative Examples 4 and 5.

In polyarylamine compounds such as polyaniline, given that the quinoid structure within the molecule is thought to contribute significantly to increased electrical conductivity of the thin-film, one would assume that the electrical conductivity would markedly decrease when a charge-transporting thin-film is produced using, within the varnish of Example 1-1, a compound such as DPBZ which does not adopt a quinoid structure.

However, the data in FIG. 3 and Table 2 show that a DPBZ-containing thin-film, although it does not adopt a quinoid structure, exhibits a better electrical conductivity than thin-films containing BDDMD and BDDE which adopt a quinoid structure. It is thus apparent that results at variance with the above assumption are obtained.

As indicated above, the thin-film obtained from the varnish in Example 1-1 exhibits a high transparency and, although it does not adopt a quinoid structure, exhibits a high electrical conductivity.

[3] Production of OLED Devices and Evaluation of Device Characteristics

Example 3-1

Using the varnish obtained in Example 1-1 and the same substrate as in Example 2-1, a uniform 30 nm thin-film was formed on the ITO substrate by the same method as in Example 2-1.

An OLED device was obtained by using a vapor deposition system to deposit thin-films of α-NPD, Alq$_3$, lithium fluoride and aluminum as successive layers on the ITO substrate having a thin-film formed thereon. The film thicknesses were set to, respectively, 30 nm, 40 nm, 0.5 nm and 120 nm, the degree of vacuum was set to $1.3 \times 10^{-3}$ Pa, and the vapor deposition rate was set to 0.02 nm/s for LiF and 0.2 nm/s for the other materials.

The OLED device was sealed in the same way as in Example 2-1.

Examples 3-2 to 3-9

Aside from using the respective varnishes obtained in Examples 1-2 to 1-9, OLED devices were produced in the same way as in Example 3-1.

Comparative Examples 6 to 8

Aside from using the respective varnishes obtained in Comparative Examples 1 to 3, OLED devices were produced in the same way as in Example 3-1.

Comparative Example 9

Instead of using a varnish to form a thin-film, a uniform 30-nm thin-film composed solely of DPBZ was formed on an ITO substrate by a vapor deposition method using DPBZ as the vapor deposition source (vapor deposition rate, 0.2 nm/s). Aside from this, an OLED device was produced in the same way as in Example 3-1.

Figure 4:
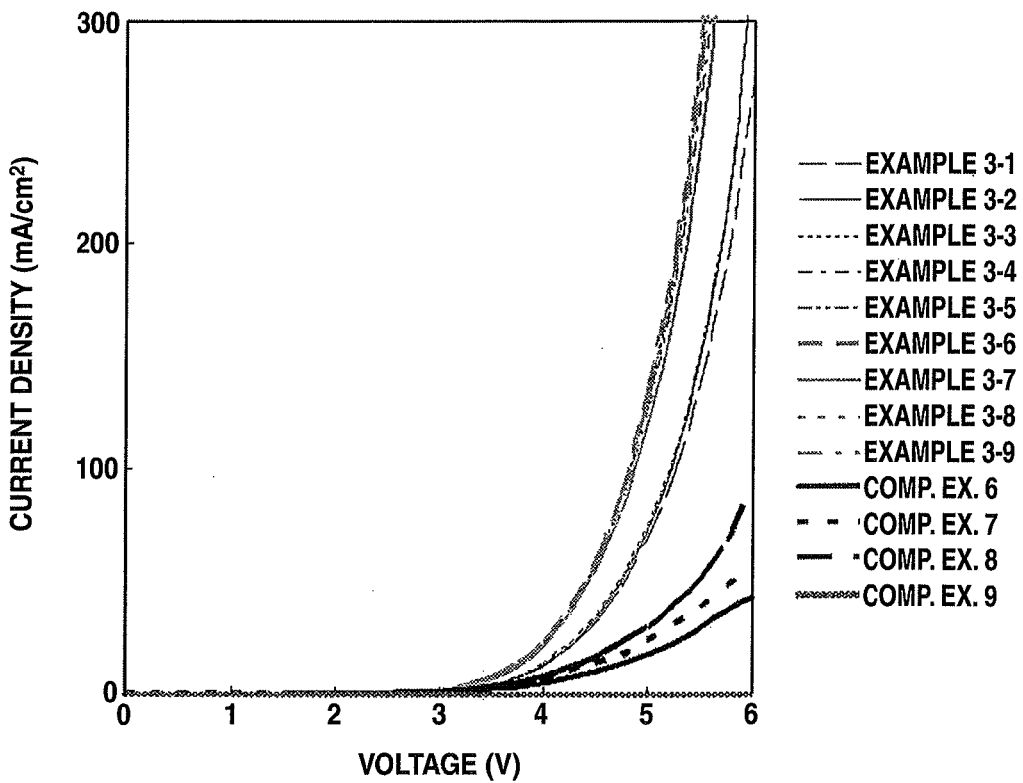
FIG. 4 is a graph showing the voltage-current density characteristics of the OLEDs obtained in Examples 3-1 to 3-9 and Comparative Examples 6 to 9.
Figure 5:
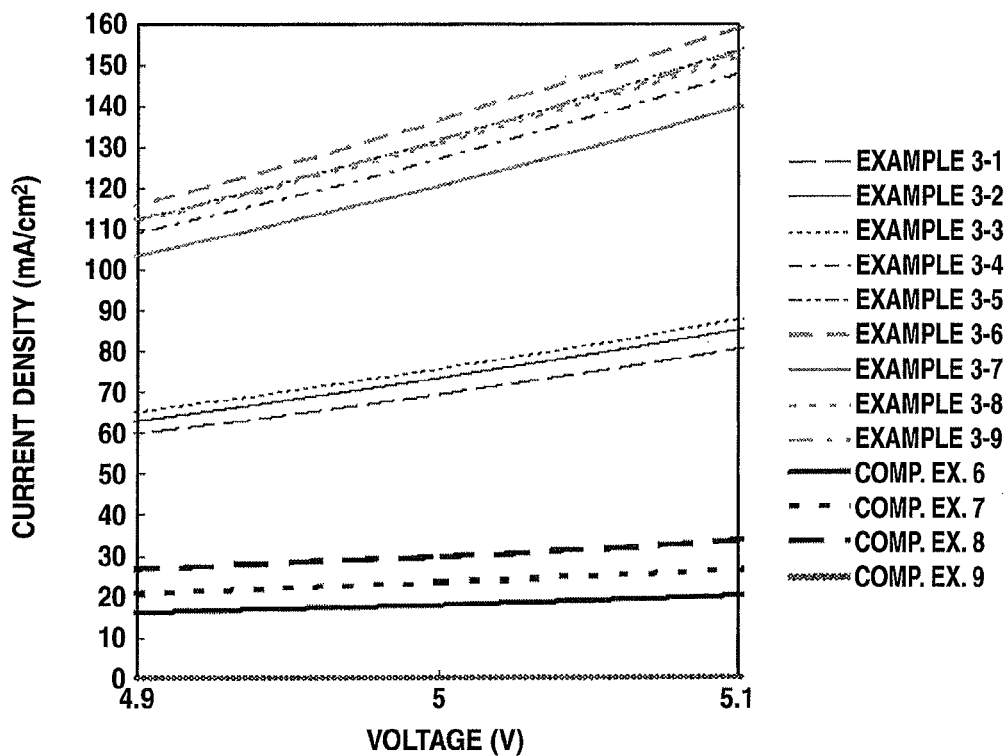
FIG. 5 is an enlarged view of the 4.9 to 5.1 V portion in FIG. 4.
Figure 6:
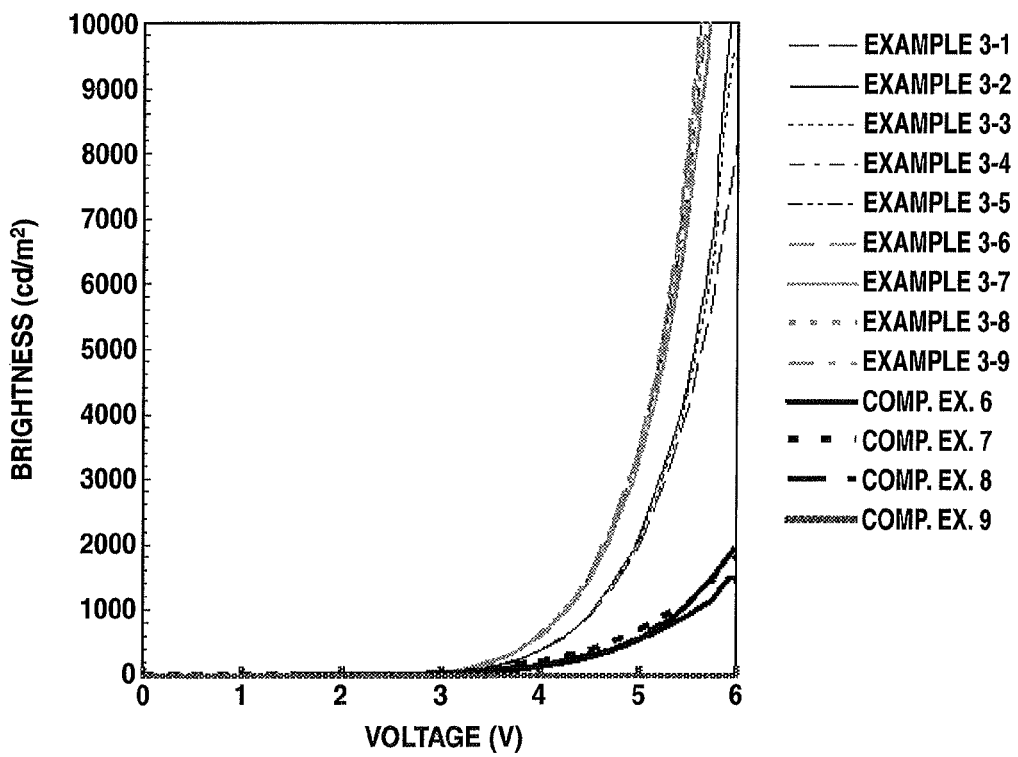
FIG. 6 is a graph showing the voltage-luminance characteristics of the OLEDs obtained in Examples 3-1 to 3-9 and Comparative Examples 6 to 9.
Figure 7:
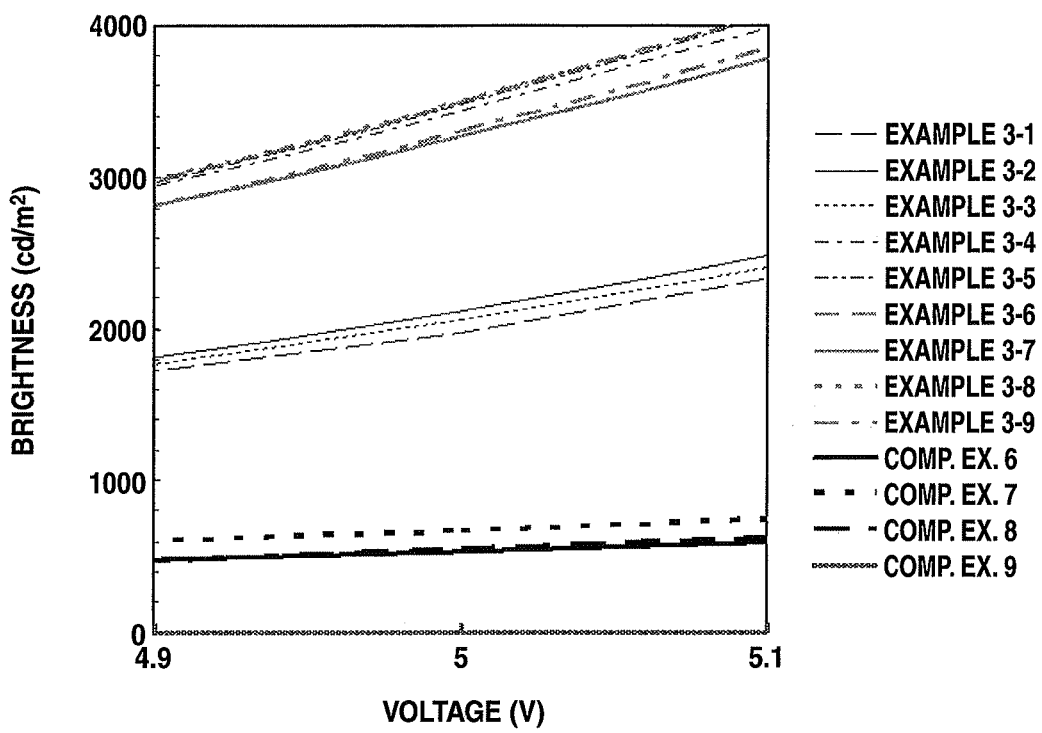
FIG. 7 is an enlarged view of the 4.9 to 5.1 V portion in FIG. 6.

The electrical characteristics of the OLED devices obtained in Examples 3-1 to 3-9 and in Comparative Examples 6 to 9 were measured using a current-voltage-luminance measurement system. FIGS. 4 and 5 show the voltage—current density characteristics, and FIGS. 6 and 7 show the voltage—luminance characteristics. Table 3 shows the current densities and luminances at a driving voltage of 5 V.

TABLE 3

| | Current density (mA/cm$^2$) | Luminance (cd/m$^2$) |
|---|---|---|
| Example 3-1 | 69 | 1,973 |
| Example 3-2 | 73 | 2,115 |
| Example 3-3 | 75 | 2,064 |
| Example 3-4 | 127 | 3,443 |
| Example 3-5 | 132 | 3,479 |
| Example 3-6 | 136 | 3,499 |
| Example 3-7 | 121 | 3,275 |
| Example 3-8 | 130 | 3,504 |
| Example 3-9 | 132 | 3,301 |
| Comparative Example 6 | 18 | 533 |
| Comparative Example 7 | 23 | 660 |
| Comparative Example 8 | 29 | 539 |
| Comparative Example 9 | 0.002 | 0.022 |

As shown in Table 3 and FIGS. 6 and 7, the OLED devices produced in Examples 3-1 to 3-9 exhibit higher luminances than the devices produced in Comparative Examples 6 to 9. In particular, they exhibit good luminance characteristics even when compared with the device produced in Comparative Example 8 using a compound (formula [4]) having a structure very similar to those of the compounds used in the working examples. Moreover, the device produced in Comparative Example 9 using a vapor-deposited thin-film composed solely of DPBZ emitted substantially no light.

It has already been ascertained that the thin-films produced using the varnishes of Examples 1-1 to 1-9 have excellent transparencies. However, as shown in Table 3 and FIGS. 6 and 7, it is apparent that thin-films capable of achieving excellent transparency and excellent luminance can be produced only when a compound of above formula [1] and an electron-accepting dopant substance are used in combination.

Next, evaluations of the life characteristics of the OLED devices obtained in Examples 3-1 to 3-3 and Comparative Examples 6 to 8 were carried out using the PEL-105S organic EL luminance life evaluation system.

Figure 8:
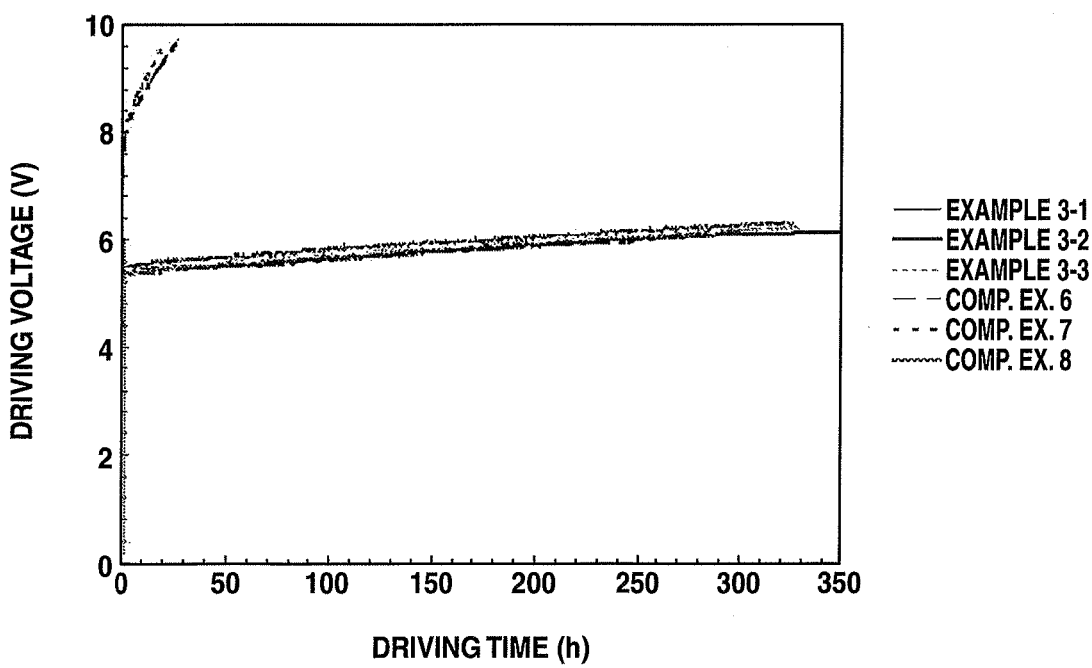
FIG. 8 is a graph showing the behavior of the driving voltage versus driving time for the OLEDs obtained in Examples 3-1 to 3-3 and Comparative Examples 6 to 8.
Figure 9:
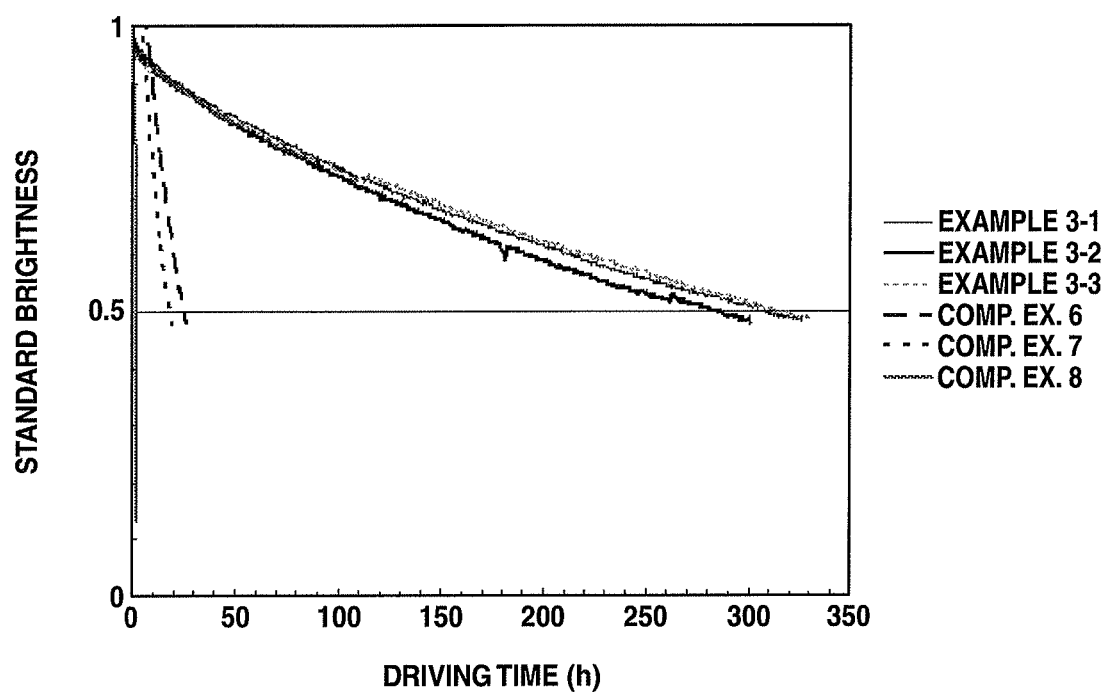
FIG. 9 is a graph showing the attenuation of luminance versus driving time for the OLEDs obtained in Examples 3-1 to 3-3 and Comparative Examples 6 to 8.

FIG. 8 shows the behavior of the driving voltage versus the driving time, FIG. 9 shows the attenuation of luminance is versus driving time, and Table 4 shows the initial luminance, driving current, half-life, initial driving voltage, driving voltage after luminance half-life, and voltage rise for each OLED device.

TABLE 4

|  | Initial luminance (cd/m$^2$) | Driving current (mA) | Half-life (h) | Initial driving voltage (V) | Driving voltage after luminance half-life (V) | Voltage rise (V) |
| --- | --- | --- | --- | --- | --- | --- |
| Example 3-1 | 5000 | 7.3 | 308.3 | 5.49 | 6.10 | 0.6 |
| Example 3-2 | 4978 | 6.9 | 284.1 | 5.38 | 5.13 | 0.8 |
| Example 3-3 | 5020 | 7.2 | 316.2 | 5.36 | 6.20 | 0.8 |
| Comparative Example 6 | 5047 | 5.0 | 25.0 | 7.22 | 9.68 | 2.5 |
| Comparative Example 7 | 4988 | 5.1 | 17.8 | 6.99 | 9.53 | 2.5 |
| Comparative Example 8 | 1000 | 2.2 | 0.8 | 5.45 | 5.89 | 0.4 |

As shown in FIGS. 8 and 9 and in Table 4, the devices produced in Comparative Examples 6 to 8 had luminance half-lives of about 1 to 25 hours. In particular, the durability of the device produced in Comparative Example 8 using a compound (formula [4]) having a structure very similar to those of the compounds used in the working examples markedly decreased, whereas the OLED devices produced in Examples 3-1 to 3-3 according to the invention had luminance half-lives of about 280 to 320 hours, and thus exhibited excellent durability.

Hence, it is apparent that not only do the OLED devices produced in Examples 3-1 to 3-3 according to the invention have good emission characteristics, they also have a high durability.

The invention claimed is:

1. A coating-type charge-transporting varnish for forming a charge-transporting thin film, said coating-type charge-transporting varnish being characterized by comprising:

(I) an aryldiamine compound of formula (1)

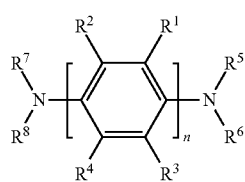

wherein
$R^1$ to $R^4$ are each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons;
$R^5$ to $R^8$ are each independently a hydrogen atom, a phenyl group, a naphthyl group, a pyridyl group, a pyrimidinyl group, a pyridazinyl group, a pyrazinyl group, a furanyl group, a pyrrolyl group, a pyrazolyl group, an imidazolyl group, a thienyl group, which groups may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons, or a group of formula (2), with the proviso that at least one of $R^5$ to $R^8$ is a hydrogen atom,

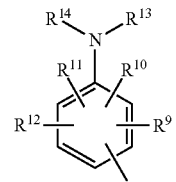

$R^9$ to $R^{12}$ being each independently a hydrogen atom, a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons; and $R^{13}$ and $R^{14}$ being each independently a phenyl group, a naphthyl group, an anthryl group, a pyridyl group, a pyrimidinyl group, a pyridazinyl group, a pyrazinyl group, a furanyl group, a pyrrolyl group, a pyrazolyl group, an imidazolyl group, a thienyl group, which groups may mutually bond to form a ring, and may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons; and n is an integer from 2 to 5, (II) an electron-accepting dopant substance, and (III) a solvent consisting of at least one organic solvent.

2. The charge-transporting varnish according to claim 1, wherein $R^5$ and $R^7$ are hydrogen atoms; and $R^6$ and $R^8$ are each independently a phenyl group, which phenyl group may be substituted with a halogen atom, a nitro group, a cyano group, a hydroxyl group, a thiol group, a phosphoric acid group, a sulfonic acid group, a carboxyl group, an alkoxy group of 1 to 20 carbons, a thioalkoxy group of 1 to 20 carbons, an alkyl group of 1 to 20 carbons, a haloalkyl group of 1 to 20 carbons, a cycloalkyl group of 3 to 20 carbons, a bicycloalkyl group of 6 to 20 carbons, an alkenyl group of 2 to 20 carbons, an alkynyl group of 2 to 20 carbons, an aryl group of 6 to 20 carbons, an aralkyl group of 7 to 20 carbons, or an acyl group of 1 to 20 carbons, or a group of formula (2).

3. The charge-transporting varnish according to claim 1 or 2, wherein $R^1$ to $R^4$ are each independently a hydrogen atom, a halogen atom, an alkyl group of 1 to 4 carbons, a perfluoroalkyl group of 1 to 4 carbons or an alkoxy group of 1 to 4 carbons; $R^5$ and $R^7$ are hydrogen atoms; and $R^6$ and $R^8$ are each independently a phenyl group or a group of formula (2')

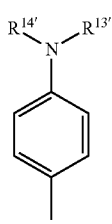

(2')

wherein $R^{13'}$ and $R^{14'}$ are each independently a phenyl group, a naphthyl group, an anthryl group or a biphenyl group, which groups may be substituted with a halogen atom, an alkyl group of 1 to 4 carbons, a perfluoroalkyl group of 1 to 4 carbons, or an alkoxy group of 1 to 4 carbons.

4. The charge-transporting varnish according to claim 1, wherein n is 2 or 3.

5. The charge-transporting varnish according to claim 1, wherein the electron-accepting dopant substance comprises an arylsulfonic acid compound.

6. The charge-transporting varnish according to claim 1, wherein the electron-accepting dopant substance is a combination of an arylsulfonic acid compound and a heteropolyacid compound.

7. The charge-transporting varnish according to claim 5 or 6, wherein the arylsulfonic acid compound has formula (3)

(3)

wherein X is oxygen or sulfur;

A is a naphthalene ring or anthracene ring which may have, as substituents other than X and a number p of ($SO_3H$) groups, one or more substituent selected from among halogen atoms, nitro groups, cyano groups, hydroxyl groups, thiol groups, phosphoric acid groups, sulfonic acid groups, carboxyl groups, alkoxy groups of 1 to 20 carbons, thioalkoxy groups of 1 to 20 carbons, alkyl groups of 1 to 20 carbons, haloalkyl groups of 1 to 20 carbons, cycloalkyl groups of 3 to 20 carbons, bicycloalkyl groups of 6 to 20 carbons, alkenyl groups of 2 to 20 carbons, alkynyl groups of 2 to 20 carbons, aryl groups of 6 to 20 carbons, aralkyl groups of 7 to 20 carbons and acyl groups of 1 to 20 carbons;

B is a divalent or trivalent benzene ring, a divalent p-xylylene group, a divalent or trivalent naphthalene ring, a divalent to tetravalent perfluorobiphenyl group, or a divalent 2,2-bis((hydroxypropoxy)phenyl)propyl group;

p is an integer from 1 to 4 that represents the number of sulfonic acid groups which bond to A; and q is an integer from 2 to 4 that represents the number of bonds between B and X.

8. The charge-transporting varnish according to claim 7, wherein X is oxygen and A is a naphthalene ring or an anthracene ring.

9. A charge-transporting thin-film produced by a method comprising the step of coating the charge-transporting varnish according to claim 1 onto a substrate.

10. An organic electroluminescent device comprising the charge-transporting thin-film according to claim 9.

11. The organic electroluminescent device according to claim 10, wherein the charge-transporting thin-film is a hole injection layer or a hole transport layer.

12. A method of manufacturing an organic electroluminescent device, comprising the step of producing a charge-transporting thin-film by using the charge-transporting varnish of claim 1, wherein the charge-transporting thin-film production step includes a film-forming step in which the charge-transporting varnish of claim 1 is applied to a substrate by spin coating, spraying, inkjet printing, or slit coating.

13. The method of manufacturing an organic electroluminescent device according to claim 12, wherein the charge-transporting thin-film is a hole injection layer or a hole transport layer.

14. The charge-transporting varnish according to claim 5, wherein the amount of the electron-accepting dopant substance, expressed as a molar ratio, is from 0.1 to 10 mole per mole of the charge-transporting substance.

15. The charge-transporting varnish according to claim 6, wherein the heteropolyacid compound is phosphotungstic acid, and the weight ratio of the electron-accepting dopant substance, which is the sum of the weight of the arylsulfonic acid compound and the weight of phosphotungstic acid, with respect to a value of 1 for the charge-transporting substance, is from 1.0 to 4.0, and the ratio by weight of arylsulfonic acid, with respect to a value of 1 for the phosphotungstic acid, is from 0.2 to 6.0.

16. The charge-transporting varnish according to claim 1, wherein said organic solvent comprises:
   (i) a high-solvency solvent selected from the group consisting of N,N-dimethylformamide, N,N-dimethylacetamide, N-methylpyrrolidone, 1,3-dimethyl-2-imidazolidinone, diethylene glycol monomethyl ether, and mixtures thereof, and optionally comprises
   (ii) a high-viscosity organic solvent selected from the group consisting of cyclohexanol, ethylene glycol, ethylene glycol diglycidyl ether, 1,3-octylene glycol, diethylene glycol, dipropylene glycol, triethylene glycol, tripropylene glycol, 1,3-butanediol, 2,3-butanediol, 1,4-butanediol, propylene glycol, hexylene glycol, and mixtures thereof, and/or
   (iii) a solvent selected from the group consisting of ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, diethylene glycol monoethyl ether, diacetone alcohol, γ-butyrolactone, ethyl lactate, and n-hexyl acetate.

* * * * *